United States Patent
Shikata et al.

(10) Patent No.: US 8,618,665 B2
(45) Date of Patent: Dec. 31, 2013

(54) PATTERN LAYOUT IN SEMICONDUCTOR DEVICE

(75) Inventors: Go Shikata, Yokohama (JP); Fumiharu Nakajima, Yokohama (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 13/234,170

(22) Filed: Sep. 16, 2011

(65) Prior Publication Data

US 2012/0106282 A1    May 3, 2012

(30) Foreign Application Priority Data

Oct. 29, 2010  (JP) ................... 2010-244657

(51) Int. Cl.
  *H01L 23/48*   (2006.01)
  *G11C 7/06*   (2006.01)
(52) U.S. Cl.
  USPC ........................................ 257/773; 365/205
(58) Field of Classification Search
  CPC ....... H01L 23/48; H01L 27/10; H01L 21/336; H01L 21/768; H01L 21/82; H01L 21/8247; H01L 27/115; H01L 29/788; H01L 29/792; G11C 7/06
  USPC ........................................ 257/773; 356/205
  See application file for complete search history.

(56) References Cited

U.S. PATENT DOCUMENTS

| | | | |
|---|---|---|---|
| 7,682,757 | B2 | 3/2010 | Mashita et al. |
| 2003/0003664 | A1* | 1/2003 | Takeuchi et al. ............. 438/266 |
| 2007/0243707 | A1 | 10/2007 | Manger et al. |
| 2010/0232225 | A1* | 9/2010 | Suzuki et al. ............ 365/185.18 |

FOREIGN PATENT DOCUMENTS

| | | |
|---|---|---|
| JP | 7-183404 | 7/1995 |
| JP | 2001-24070 | 1/2001 |
| JP | 2004-134702 | 4/2004 |
| JP | 2004-321546 | 11/2004 |
| JP | 2006-196486 | 7/2006 |
| JP | 2006-293081 | 10/2006 |
| JP | 2008-191403 | 8/2008 |
| JP | 2009-31716 | 2/2009 |
| JP | 2009-42660 | 2/2009 |
| JP | 2009-49034 | 3/2009 |

OTHER PUBLICATIONS

Notice of Reasons for Rejection issued Feb. 7, 2012 in Japanese Patent Application No. 2010-244657( with English translation).

* cited by examiner

*Primary Examiner* — Walter H Swanson
(74) *Attorney, Agent, or Firm* — Oblon, Spivak, McClelland, Maier & Neustadt, L.L.P.

(57) ABSTRACT

According to one embodiment, a semiconductor device having a pattern layout includes a first interconnect pattern and a contact pad. The first interconnect pattern includes lines and spaces which are alternately aligned in a first direction with a predetermined pitch. The contact pad is arranged between the lines in the first interconnect pattern and has a width that is triple the predetermined pitch. An interval between the line in the first interconnect pattern and the contact pad is the predetermined pitch, and the predetermined pitch is 100 nm or below.

13 Claims, 13 Drawing Sheets

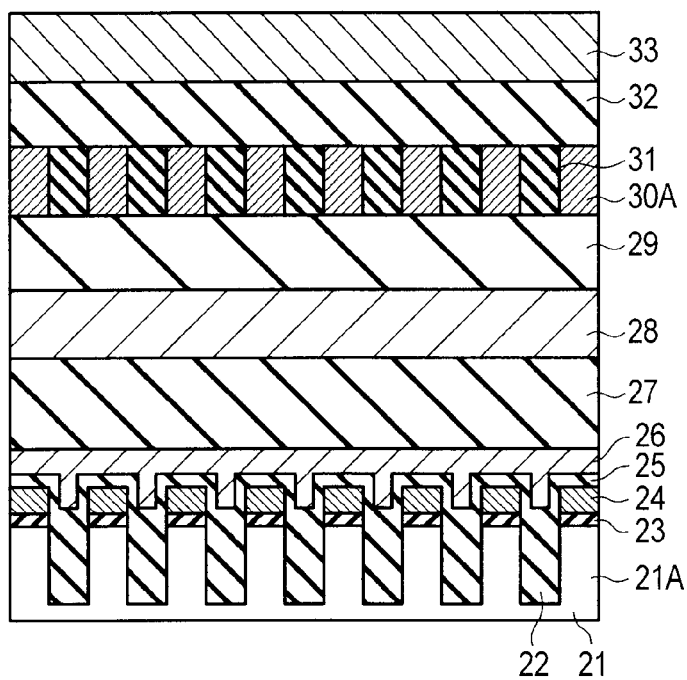
F I G. 2
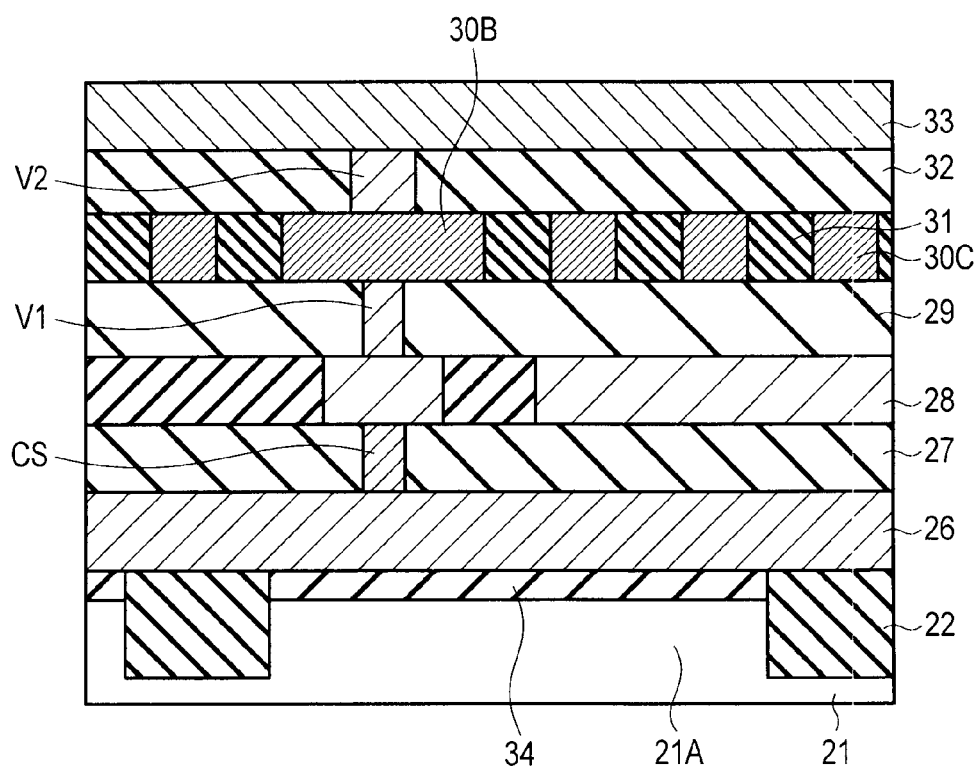
F I G. 3

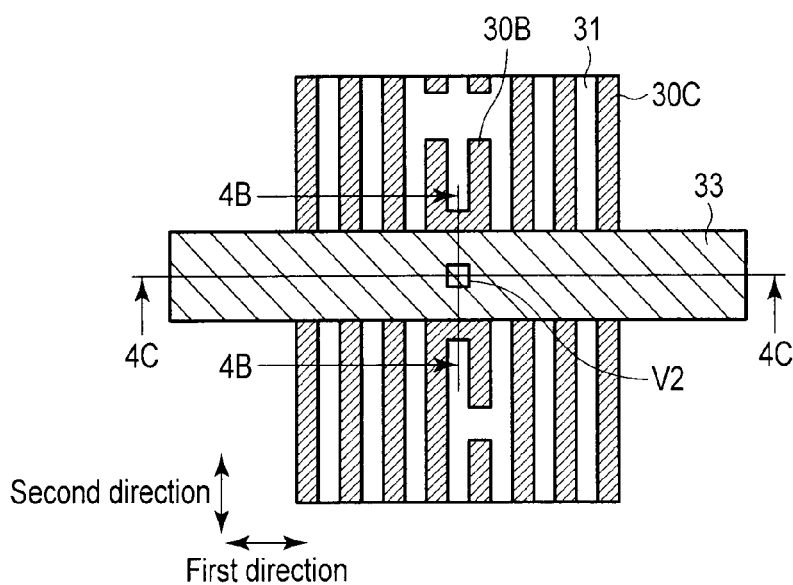
F I G. 4A
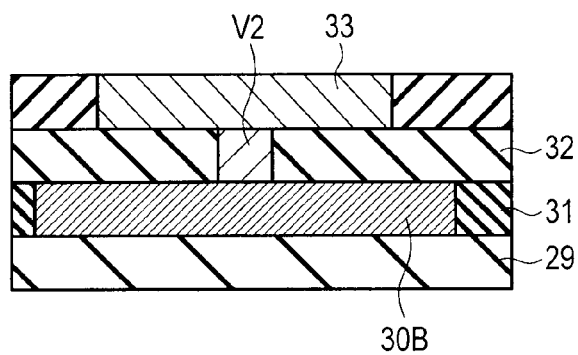
F I G. 4B
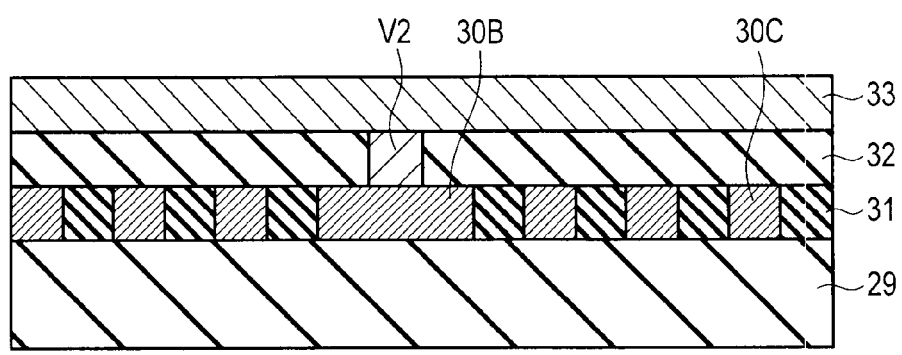
F I G. 4C

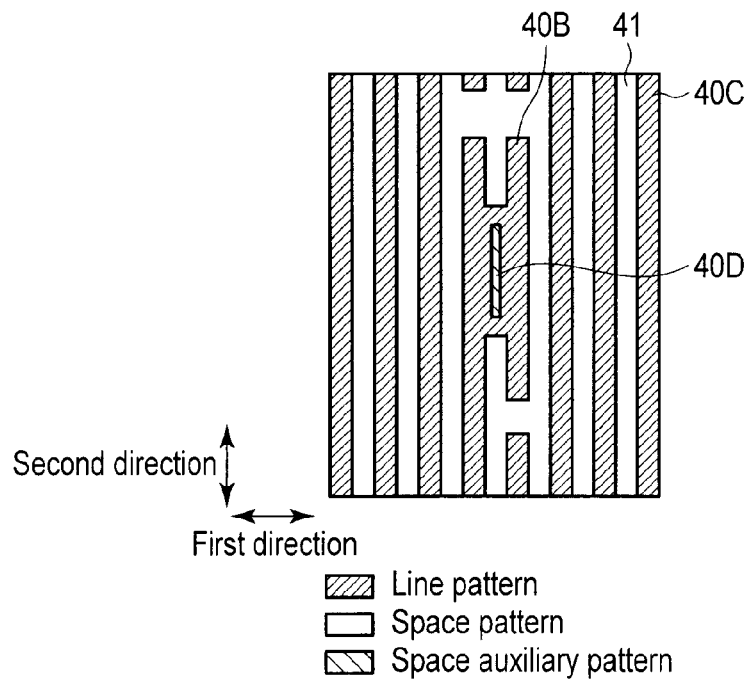
F I G. 5
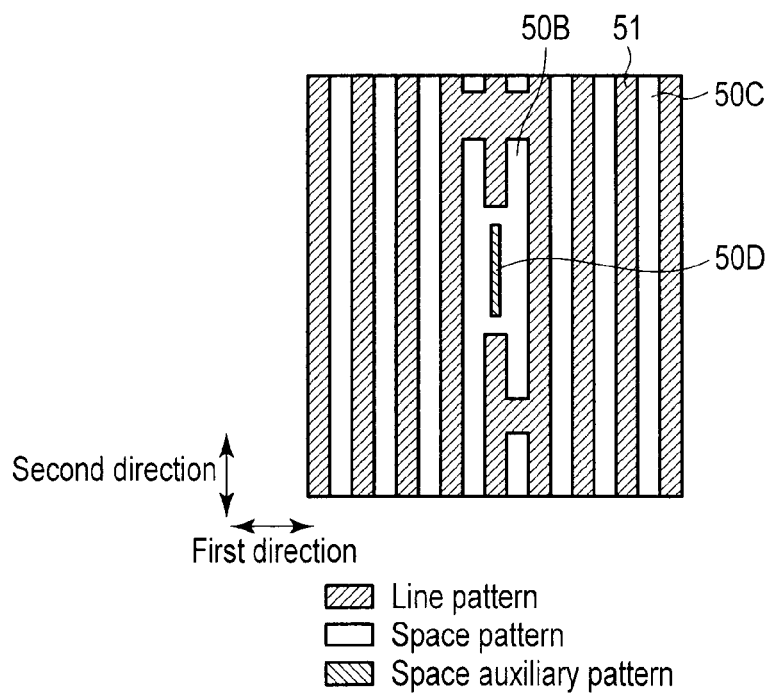
F I G. 6

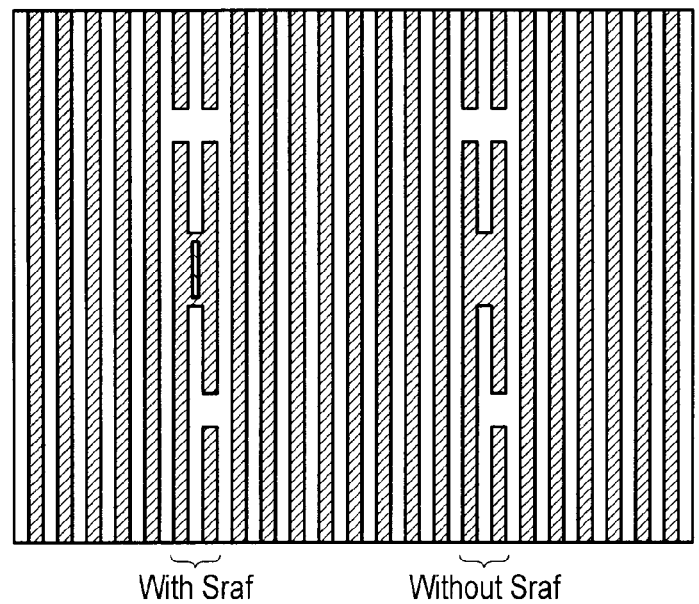
F I G. 7
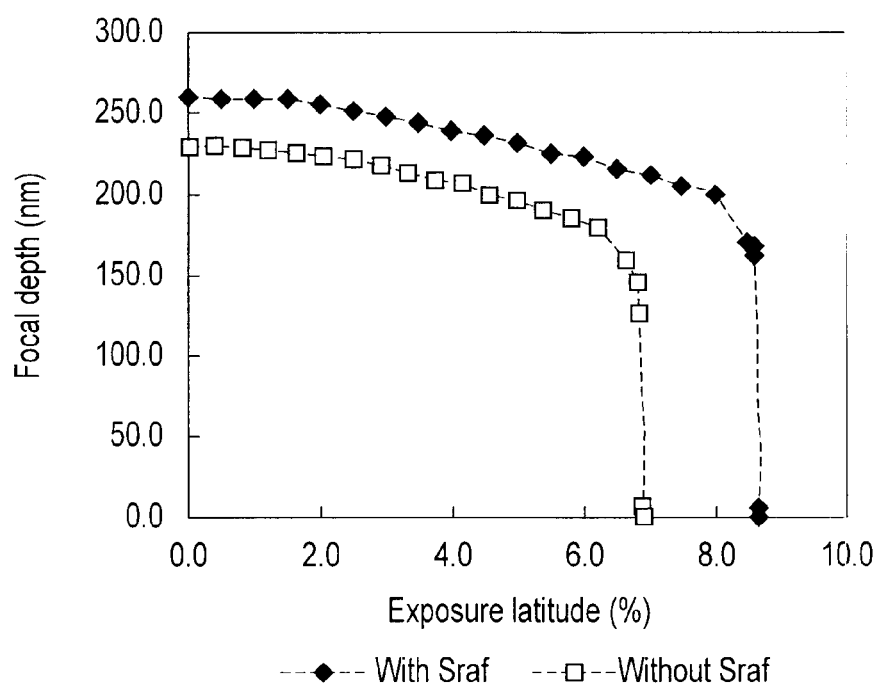
F I G. 8

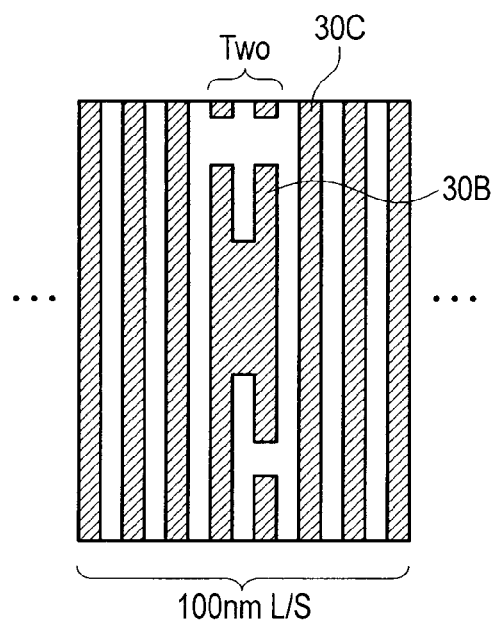
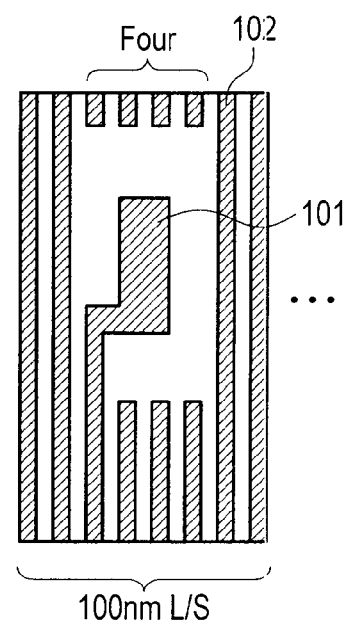
FIG. 9A          FIG. 9B
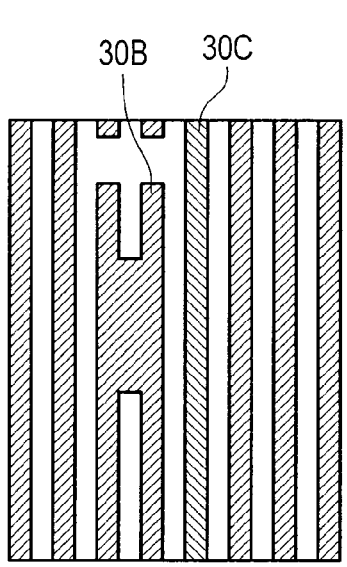
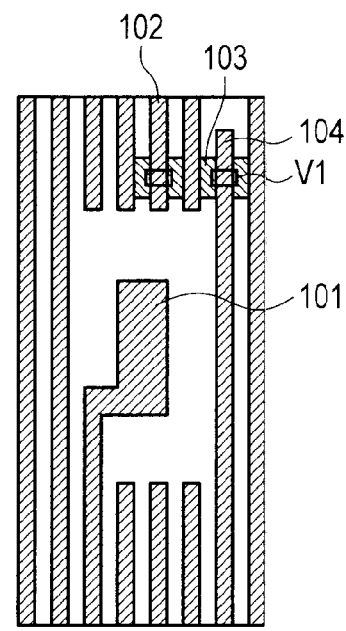
FIG. 10A         FIG. 10B

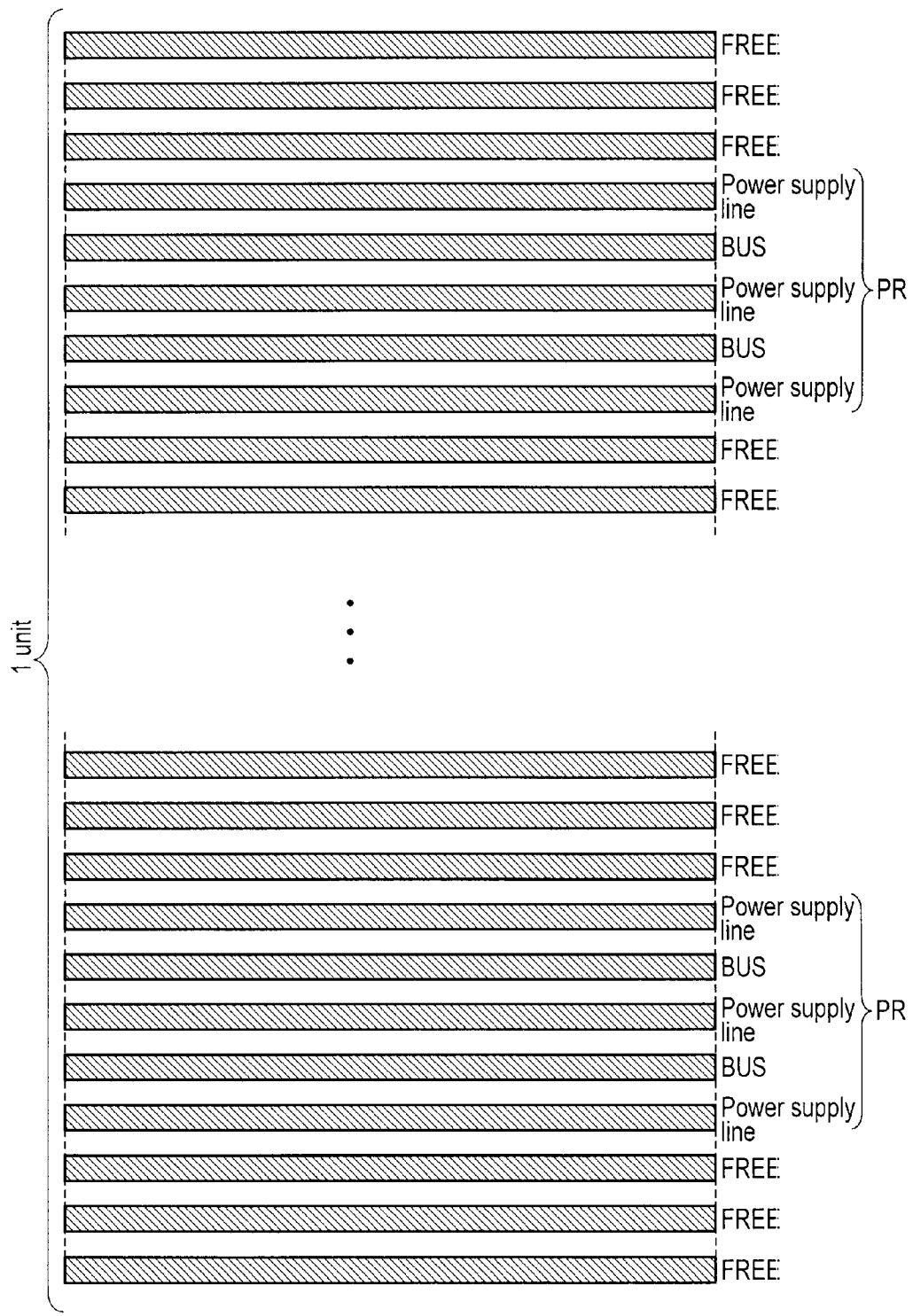
F I G. 11

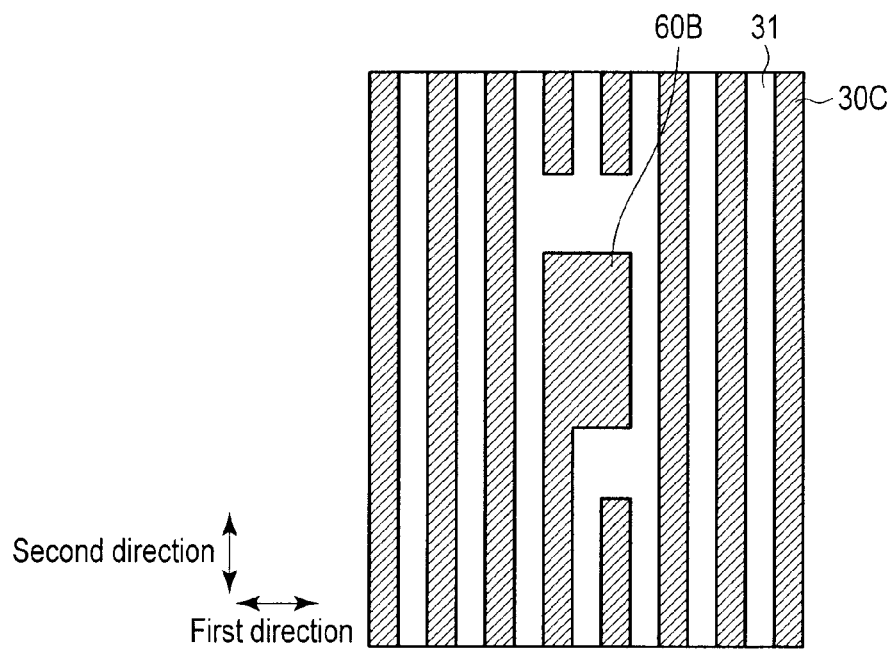
F I G. 14
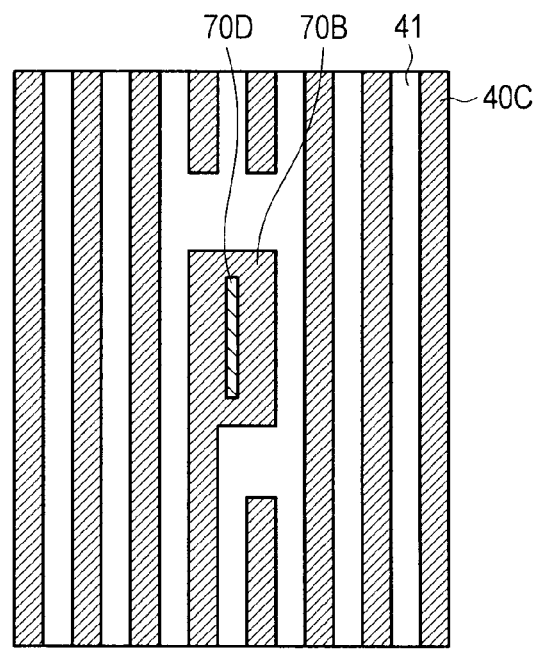
F I G. 15

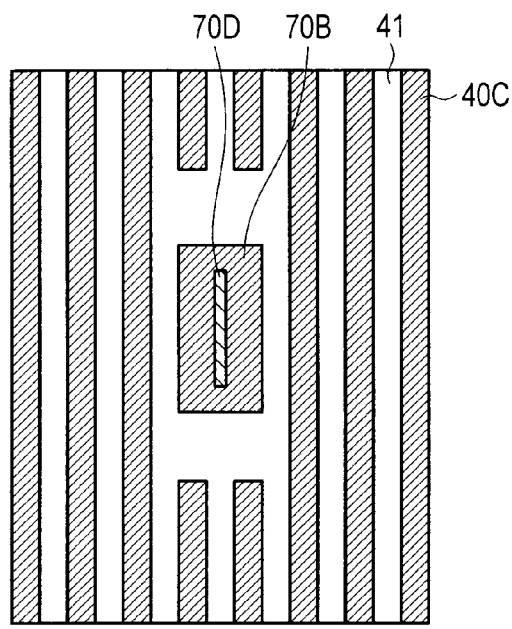
F I G. 16
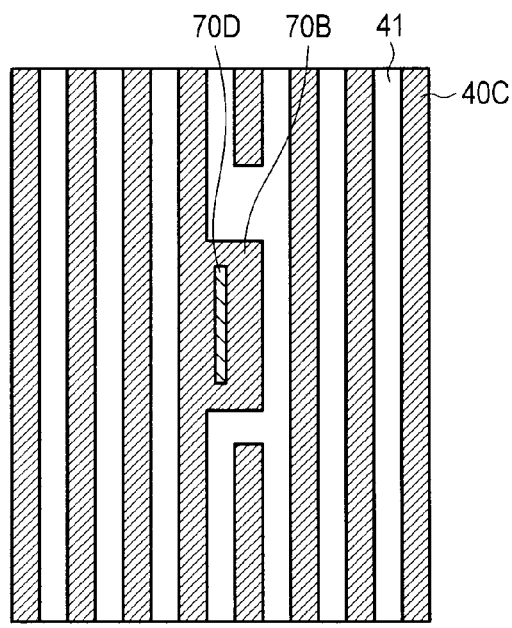
F I G. 17

▨ Line pattern
☐ Space pattern
▧ Space auxiliary pattern

▨ Line pattern
☐ Space pattern
▧ Space auxiliary pattern

▨ Line pattern
☐ Space pattern
▧ Space auxiliary pattern

1

PATTERN LAYOUT IN SEMICONDUCTOR DEVICE

CROSS-REFERENCE TO RELATED APPLICATIONS

This application is based upon and claims the benefit of priority from prior Japanese Patent Application No. 2010-244657, filed Oct. 29, 2010, the entire contents of which are incorporated herein by reference.

FIELD

Embodiments described herein relate generally to a semiconductor device.

BACKGROUND

In a NAND flash memory, which is a type of semiconductor device, a line and space (L&S) repetitive pattern that has a size close to a resolution limit and is drawn based on a designed rule is used for bit lines or word lines of a memory cell unit.

A pattern of an integrated circuit in the NAND flash memory and the like is exposed by using a photomask. In the exposure of the memory cell unit, although a resolution in the repetitive pattern in a central part of the memory cell unit is high, there is a problem that a resolution in a boundary part at an end portion of the memory cell unit is lowered.

To solve this problem, there is known a method of arranging an auxiliary pattern (Sraf: sub resolution assist feature) or a dummy pattern configured to maintain periodicity on the mask aside from a primary pattern. In this method, for example, the auxiliary pattern is arranged on the mask so that a design pattern dimension coincides with a resist pattern dimension.

Further, with the advancement in miniaturization, in a core circuit unit of a sense amplifier or a row decoder, an L&S pattern drawn based on a design rule having a hard resolution, which is not as stringent as that in the memory cell unit, is likewise present. Furthermore, in the core circuit unit, a wide portion (a contact pad) configured to achieve electrical connection with a signal interconnect line or a power supply interconnect line in an upper layer is required in, e.g., an L&S periodic pattern.

However, in a pattern surrounding portion that disrupts the periodicity of such an L&S pattern, since a lithography margin is reduced, pattern formation is difficult.

Moreover, to provide the contact pad having a width that is several-fold of a pattern pitch in the L&S periodic pattern, a large space must be assured between a interconnect line and the contact pad based on restrictions of an MSR (Multi Space Rule) and the like, and there is a problem that the number of interconnect lines that can be arranged around the contact pad is reduced.

BRIEF DESCRIPTION OF THE DRAWINGS

FIG. 2 is a cross-sectional view taken along a word line of a memory cell array according to the first embodiment;

FIG. 3 is a cross-sectional view taken along a word line of a sense amplifier according to the first embodiment;

FIG. 4A is a plan view of a pattern layout according to the first embodiment;

FIGS. 4B and 4C are cross-sectional views of the pattern layout according to the first embodiment;

FIGS. 5 and 6 are plan views of a mask pattern of a photomask used for manufacturing the pattern Layout according to the first embodiment;

FIG. 7 is a plan view showing a mask pattern when a space auxiliary pattern is present/absent;

FIG. 8 is a view showing a focal depth and an exposure latitude when the space auxiliary pattern is present/absent;

FIG. 9A is a plan view of a pattern layout according to the first embodiment;

FIG. 9B is a plan view showing a pattern layout according to a comparative example;

FIG. 10A is a plan view of a pattern layout according to the first embodiment;

FIG. 10B is a plan view of a pattern layout according to a comparative example;

FIG. 11 is a plan view of a pattern layout of an M1 interconnect layer formed in one unit of the sense amplifier according to the first embodiment;

FIG. 14 is a plan view of a pattern layout according to a second embodiment;

FIG. 15 is a plan view of a mask pattern of a photomask used for manufacturing the pattern layout according to the second embodiment; and FIGS. 16-20 are plan views of mask patterns of photomasks according to other embodiments.

DETAILED DESCRIPTION

Figure 1:
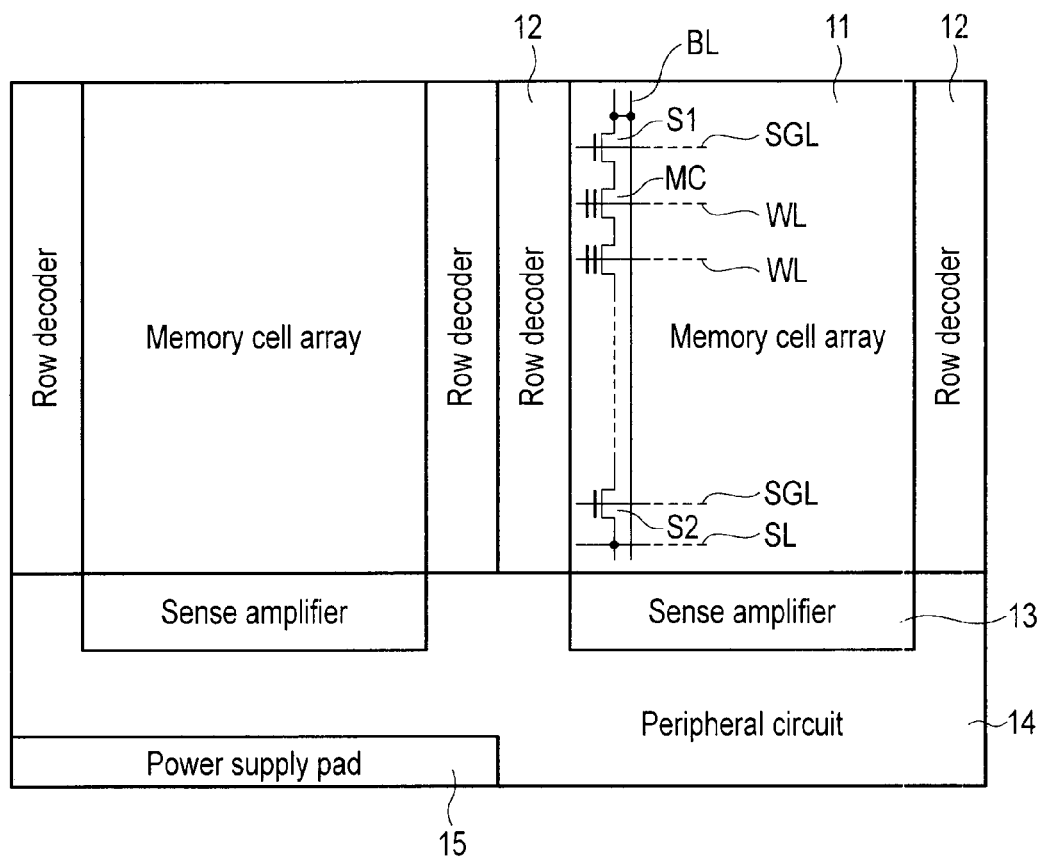
FIG. 1 is a block diagram showing an entire configuration of a NAND flash memory according to a first embodiment.

A semiconductor device having a pattern layout and a manufacturing method of the semiconductor device according to an embodiment will now be described hereinafter with reference to the drawings. Here, a NAND flash memory will be taken as an example of the semiconductor device. It is to be noted that like reference numerals denote constituent elements having the same functions and structures, and an overlapping explanation will be given only when required.

In general, according to one embodiment, a semiconductor device having a pattern layout includes a first interconnect pattern and a contact pad. The first interconnect pattern includes lines and spaces which are alternately aligned in a first direction with a predetermined pitch. The contact pad is arranged between the lines in the first interconnect pattern and has a width that is triple the predetermined pitch. An interval between the line in the first interconnect pattern and the contact pad is the predetermined pitch, and the predetermined pitch is 100 nm or below.

First Embodiment

[1] Configuration of NAND Flash Memory

A NAND flash memory having a pattern layout formed therein according to a first embodiment will be described.

FIG. 1 is a block diagram showing an entire configuration of an NAND flash memory according to the first embodiment.

As shown in the drawing, the NAND flash memory comprises a memory cell array 11, row decoders 22, a sense amplifier 13, a peripheral circuit 14, and a power supply pad 15. In FIG. 1, the row decoders 12 are arranged at both ends (left and right ends) of the memory cell array 11, and the sense amplifier 13 is arranged at a lower end of the memory cell array 11. The peripheral circuit 14 is arranged on a lower side of the sense amplifier 13. Further, the power supply pad 15 is arranged at a lower portion of the peripheral circuit 14.

The memory cell array 11 has NAND cell units. The NAND cell unit has memory cells MC and select gate transistors S1 and S2 connected to both ends to sandwich the memory cells MC. The memory cell MC is constituted of a nonvolatile memory cell transistor including a floating gate electrode and a control gate electrode. One end of the NAND cell unit is connected to a bit line BL through the select gate transistor S1, and the other end is connected to a common source line SL through a select gate transistor S2. The control gate electrode of each memory cell MC in the same row is connected to a word line WL. Moreover, a control gate electrode of each of the select gate transistors S1 and S2 is connected to a select gate line SGL.

The row decoder 12 selects a specific word line WL from the word lines WL connected to the memory cells MC in the memory cell array 11 based on an address. The sense amplifier 13 reads data stored in the memory cells MC through the bit line BL connected to the memory cells MC.

The peripheral circuit 14 has a circuit configured to perform write, read, and erase operations with respect to the memory cells MC in the memory cell array 11. A power supply voltage, a reference voltage, and others required to operate the NAND flash memory are supplied to the power supply pad 15.

Cross-sectional configurations of the memory cell array 11 and the sense amplifier 13 will now be described.

FIG. 2 is a view showing a part of a cross section of the memory cell array 11 in FIG. 1 taken along the word line WL. The cross section of the memory cell array 11 is configured as follows.

In a surface region of a semiconductor substrate 21, element isolation regions 22, e.g., STIs (Shallow Trench Isolation) are arranged at predetermined intervals to form an element region (an active area) 21A. Gate insulating films (tunnel oxide films) 23 are formed on the element region 21A, and floating gate electrodes 24 are formed on the gate insulating films 23. An inter-gate insulating film 25 is formed on the floating gate electrodes 24, and a control gate electrode (the word line) 26 is formed on the inter-gate insulating film 25.

An interlayer insulating film 27 is formed on the control gate electrode 26, and an M0 interconnect layer 28 is formed on the interlayer insulating film 27. An interlayer insulating film 29 is formed on the M0 interconnect layer 28, and an M1 interconnect layer including bit lines 30A is formed on the inter-layer insulating film 29. Interlayer insulating films 31 are formed between the bit lines 30A. Additionally, an interlayer insulating film 32 is formed on the interconnect layer and the interlayer insulating films 31, and an M2 interconnect layer 33 is formed on the interlayer insulating film 32. It is to be noted that description on a configuration above the M2 interconnect layer 33 will be omitted.

The M0 interconnect layer 28 is a first interconnect layer formed on the control gate electrode (the word line) 26. Further, the M1 interconnect layer is a second interconnect layer formed on the control gate electrode 26, and the M2 interconnect layer 33 is a third interconnect layer formed on the control gate electrode 26.

Furthermore, FIG. 3 is a view showing a part of a cross section of the sense amplifier 13 taken along the word line WL in FIG. 1. The cross section of the sense amplifier 13 is configured as follows.

In the surface region of the semiconductor substrate 21, the element isolation regions 22 are arranged to form the element region 21A. A gate insulating film 34 is formed on the element region 21A, and the gate electrode 26 is formed on the gate insulating film 34.

The interlayer insulating film 27 is formed on the gate electrode 26, and the M0 interconnect layer 28 is formed on the interlayer insulating film 27. A contact plug CS is formed on the gate electrode 26, and the contact plug CS electrically connects the gate electrode 26 to the M0 interconnect layer 28.

The interlayer insulating film 29 is formed on the M0 interconnect layer 28, and the M1 interconnect layer including a contact pad 30B and interconnect lines 30C is formed on the interlayer insulating film 29. The interlayer insulating films 31 are formed between the contact pad 30B and the interconnect line 30C and between the interconnect lines 30C. A contact plug V1 is formed on the M0 interconnect line 28, and the contact plug V1 electrically connects the M0 interconnect layer 28 to the contact pad 30B.

Furthermore, the interlayer insulating film 32 is formed on the contact pad 30B, the interconnect lines 30C, and the interlayer insulating films 31, and the M2 interconnect layer 33 is formed on the interlayer insulating film 32. A contact plug V2 is formed on the contact pad 30B, and the contact plug V2 electrically connects the contact pad 30B to the M2 interconnect layer 33. It is to be noted that description on a configuration above the M2 interconnect layer 33 will be omitted.

[2] Pattern Layout on Substrate

A core circuit portion in the NAND flash memory, which is a pattern layout formed in the sense amplifier 13 in this example, will now be described.

FIG. 4A is a plan view of the pattern layout according to the first embodiment and shows the M1 interconnect layer, the M2 interconnect layer, and the contact plug V2 formed in the sense amplifier 13.

As shown in FIG. 4A, a first line pattern 30C, a space pattern 31, a contact pad 30B, a second line pattern 33, and the contact plug V2 are arranged on the interlayer insulating film on the semiconductor substrate. Each of the first line pattern 30C and the second line pattern 33 corresponds to interconnect lines made of, e.g., a metal material. The space pattern 31 is constituted of the interlayer insulating films arranged between the first line patterns 30C and between the first line pattern 30C and the contact pad 30B. The contact pad 30B is made of, e.g., a metal material, and the contact plug V2 is formed thereon. The contact plug V2 is arranged between the contact pad 30B and the second line pattern 33 to electrically connect these members.

The first line pattern 30C and the space pattern 31 are alternately aligned in a first direction with a predetermined pitch (e.g., 100 nm). The first line pattern 30C and the space pattern 31 extend in a second direction orthogonal to the first direction. The contact pad 30B having a width that is triple the predetermined pitch (e.g., 300 nm) is arranged in the layout of the aligned first line pattern 30C and space pattern 31.

In other words, a pattern array having the first line pattern 30C and the space pattern 31 alternately aligned therein is arranged on the predetermined pitch which is a fixed interval in the first directions. The contact pad 30B having the width that is triple the predetermined pitch is arranged in this pattern array. A planar shape of the contact pad 30B is an H-like shape to improve symmetry properties of the pattern array.

The second line pattern 33 extending in the first direction is arranged on the contact pad 30B, the first line pattern 30C, and the space pattern 31. The contact plug V2 is arranged in a region where the contact pad 30B crosses the second line pattern 33.

FIG. 4B is a cross-sectional view taken along a line 4B-4B in FIG. 4A. It is to be noted that a configuration between the M1 interconnect layer and the M2 interconnect layer 33 is shown, and a configuration below the interlayer insulating film 29 and a configuration above the M2 interconnect layer 33 are omitted in this drawing.

As shown in FIG. 4B, the contact pad 30B is formed on the interlayer insulating film 29 on the semiconductor substrate, and the interlayer insulating film 32 is formed on the contact pad 30B. The M2 interconnect layer 33 is formed on the interlayer insulating film 32. The contact plug V2 that electrically connects the contact pad 30B to the M2 interconnect layer 33 is formed in the interlayer insulating film 32 between the contact pad 30B and the M2 interconnect layer 33.

FIG. 4C is a cross-sectional view taken along a line 4C-4C in FIG. 4A. Here, likewise, a configuration between the M1 interconnect layer and the M2 interconnect layer 33 is shown.

As shown in FIG. 4C, the contact pad 30B and the first line pattern 30C are formed on the interlayer insulating film 29 on the semiconductor substrate, and the interlayer insulating film 32 is formed on the contact pad 30B and the first line pattern 30C. The M2 interconnect layer 33 is formed on the interlayer insulating film 32. The contact plug V2 that electrically connects the contact pad 30B to the M2 interconnect layer 33 is formed in the interlayer insulating film 32 between the contact pad 30B and the M2 interconnect layer 33.

As shown in FIG. 4A, an interval between the contact pad 30B and the first line pattern 30C that is adjacent to the contact pad 30B is equal to an interval between lines of the first line patterns 30C.

[3] Pattern Layout of Photomask

A photomask used for manufacturing the M1 interconnect layer including the contact pad 303 and the first line pattern 30C depicted in FIG. 4A will now be described.

FIG. 5 shows a mask pattern of a photomask used for manufacturing the pattern layout of the M1 interconnect layer depicted in FIG. 4A. The mask pattern shown in FIG. 5 is a mask pattern in an example where a film, which is to function as a pattern, is formed on the semiconductor substrate and then the film is etched to form the pattern.

On a photomask substrate are formed a line pattern 40B associated with the contact pad 30B depicted in FIG. 4A, a line pattern 40C associated with the first line pattern 30C, and a space pattern 41 associated with the space pattern 31.

The line pattern 40C and the space pattern 41 are alternately aligned in the first direction with a predetermined pitch (e.g., 100 nm). The line pattern 40C and the space pattern 41 extend in the second direction orthogonal to the first direction. The line pattern 40B having a width that is triple the predetermined pitch (e.g., 300 nm) is arranged in the layout of the aligned line pattern 40C and space pattern 41. A space auxiliary pattern 40D is arranged on the predetermined pitch of a space pattern in the line pattern 40B. A space width of the space auxiliary pattern 40D is, e.g., 30 nm or below. For example, a standardized dimension (=a k1 factor) is set to 0.23 or below. The k1 factor will be described later in detail. For example, assuming that a wavelength λ=193 nm and NA=1.3 are achieved based on a later-described relational expression (Expression 1), an alignment pitch (the predetermined pitch) of the line pattern and the space pattern is not greater than 35 nm. Furthermore, assuming that the wavelength λ=193 nm and NA=0.9 are achieved, the alignment pitch is not greater than 50 nm.

In other words, a pattern array having the line pattern 40C and the space pattern 41 alternately aligned therein is arranged on the predetermined pitch which is a fixed interval in the first direction. The line pattern 40B having the width that is triple the predetermined pitch is arranged in this pattern array. The space auxiliary pattern 40D is arranged on the predetermined pitch of the space pattern in the line pattern 40B. A planar shape of the line pattern 40B associated with the contact pad 30B is an H-like shape to improve symmetry properties of the pattern array.

Each of the line patterns 40B and 40C is a region having a transmission factor of 6% and a phase of 180 degrees, and each of the space pattern 41 and the space auxiliary pattern 40D is a region having a transmission factor of 100% and a phase of 0 degrees.

A photomask used for forming a pattern based on a burying method will now be described.

FIG. 6 shows a mask pattern of a photomask used for manufacturing a pattern layout of the M1 interconnect layer depicted in FIG. 4A based on the burying method.

On a substrate of a photomask are formed a space pattern 50B associated with the contact pad 30B depicted in FIG. 4A, a space pattern 50C associated with the first line pattern 30C, and a line pattern 51 associated with the space pattern 31.

The space pattern 50C and the line pattern 51 are alternately aligned in the first direction with a predetermined pitch (e.g., 100 nm). The space pattern 50C and the line pattern 51 extend in the second direction orthogonal to the first direction. The space pattern 50B having a width that is triple the predetermined pitch (e.g., 300 nm) is arranged in the layout of the aligned space pattern 50C and line pattern 51. A line auxiliary pattern 50D is arranged on a predetermined pitch of a line pattern in the space pattern 50B. A line width of the line auxiliary pattern 50D is, e.g., 30 mm or below. For example, a standardized dimension (=a k1 factor) is set to 0.23 or below.

In other words, a pattern array in which the space pattern 50C and the line pattern 51 are alternately aligned therein is arranged on the predetermined pitch which is a fixed interval in the first direction. The space pattern 50B having the width that is triple the predetermined pitch is arranged in this pattern array. The line auxiliary pattern 50D is arranged on the predetermined pitch of the line pattern in the space pattern 50B. A planar shape of the space pattern 50B associated with the contact pad 30B is an H-like shape to improve symmetry properties of the pattern array.

In the case of a halftone mask, each of the line pattern 51 and the line auxiliary pattern 50D is a region having a transmission factor of 6% and a phase of 180 degrees, and each of the space patterns 50B and 50C is a region having a transmission factor of 100% and a phase of 0 degrees. In the case of a binary mask, each of the line pattern 51 and the line auxiliary pattern 50D is a region having a transmission factor of 0%, and each of the space patterns 50B and 50C is a region having a transmission factor of 100% and a phase of 0 degrees.

Description will now be given as to a result of examining a focal depth and an exposure latitude when the space auxiliary pattern is present/absent in the mask pattern depicted in FIG. 5.

FIG. 7 is a view showing a case where the space auxiliary pattern is present and a case where the space auxiliary pattern is absent in the mask pattern when forming a film, which is to function as the pattern, and then etching the film to form the pattern. FIG. 8 shows each focal depth and each exposure latitude when the space auxiliary pattern is present/absent.

As shown in FIG. 8, it can be understood that the exposure latitude and focal depth are improved when the space auxiliary pattern is present as compared with the case that the space auxiliary pattern is absent. In the case of the binary mask, the same effects as that in the case of the halftone mask can be obtained. Therefore, forming the space auxiliary pattern enables a lithography margin to be improved.

[4] Effect

In this embodiment, the number of interconnect lines that can be arranged around the contact pad can be increased, and a freedom degree of pattern layout design can be improved. That is, the number of interconnect lines that can be formed in a predetermined region including the contact pad can be increased, whereby the freedom degree of design layout can be improved. A detailed description will now be given hereinafter with reference to FIG. 9A and FIG. 9B.

FIG. 9A shows a pattern layout according to the first embodiment, and FIG. 9B shows a pattern layout according to a comparative example.

Description will be given as to a case that a contact pad is formed in a periodic pattern portion of lines & spaces aligned with a predetermined pitch (e.g., 100 nm). As shown in FIG. 9B, in the pattern layout according to the comparative example, assuming that a contact pad 101 has a line width of, e.g., 300 nm which is triple the predetermined pitch, a space of, e.g., 200 nm or above is required between the contact pad 101 and an adjacent interconnect line 102 because of restrictions of the MSR. Therefore, a region corresponding to four interconnect lines is required for the contact pad 101 and the space.

On the other hand, in this embodiment, as shown in FIG. 9A, when forming the contact pad 30B having a line width of, e.g., 300 nm, a space between the contact pad 30B and the adjacent interconnect line 30C which is equal to a space between the interconnect lines 30C can be provided, and hence a region corresponding to two interconnect lines can suffice. Therefore, in this embodiment, the number of interconnect lines that can be arranged around the contact pad can be increased as compared with the comparative example, thereby improving the freedom degree of pattern layout design.

That is, in a case that the contact pad is formed in a region including eight interconnect lines, only four interconnect lines can be used when the pattern layout according to the conventional example is adopted. On the other hand, six interconnect lines can be used when the pattern layout according to this embodiment is adopted.

Moreover, in this embodiment, when installing each interconnect line to run from the upper side toward the lower side through a position near the contact pad, the interconnect line can be installed to run from the upper side toward the lower side in the same M1 interconnect layer without reconnecting the interconnect line to another interconnect layer around the contact pad. A detailed description will now be given with reference to FIG. 10A and FIG. 10B.

FIG. 10A shows a pattern layout according to the first embodiment, and FIG. 10B shows a pattern Layout according to a comparative example.

Description will be given as to an example where each interconnect line is installed to run from the upper side toward the lower side through a position near the contact pad. For example, as shown in FIG. 10B, when installing an interconnect line 102 that is the fifth from the left side to run from the upper side toward the lower side, the interconnect line 102 must be connected to an interconnect line 104 through a contact plug V1 and an M0 interconnect layer 103 in the comparative example.

On the other hand, in this embodiment, as shown in FIG. 10A, since a space does not have to be assured around the contact pad 30B, the interconnect line 30C that is the fifth from the left side can be directly installed to run from the upper side toward the lower side.

Additionally, in this embodiment, since the contact pads connected to the power supply lines can be dispersed and arranged in one unit of the sense amplifier 13, a current can uniformly flow through the respective power supply lines, thereby improving the reliability of the power supply lines. A detailed description will now be given hereinafter with reference to FIG. 11, FIG. 12A, FIG. 12B, FIG. 13A, FIG. 13B, and FIG. 14.

FIG. 11 is a view showing a pattern layout of the M1 interconnect layer formed in one unit of the sense amplifier 13.

The sense amplifier 13 has more than one unit. As shown in FIG. 11, each unit has signal lines FREE and BUS and pairs of power supply lines (three power supply lines sandwiching the signal lines BUS) PR. These signal lines and power supply lines are aligned with a predetermined pitch.

The signal line FREE is an interconnect line that can be arbitrarily used in accordance with a position and connects, e.g., nodes of a transistor in the sense amplifier 13 to each other, and a signal for driving the transistors in the sense amplifier 13 is transmitted through this signal line FREE. For example, a power supply voltage or a reference voltage (e.g., a ground voltage) is supplied through the power supply line in the power supply line pairs PR. Further, a data signal read from each memory cell is transmitted through the signal line BUS arranged between the power supply line and the power supply line.

Description will be given as to arrangement of the contact pad provided to each power supply line when one unit has eight pairs of power supply lines in the pattern layout in one unit.

Figure 12A:
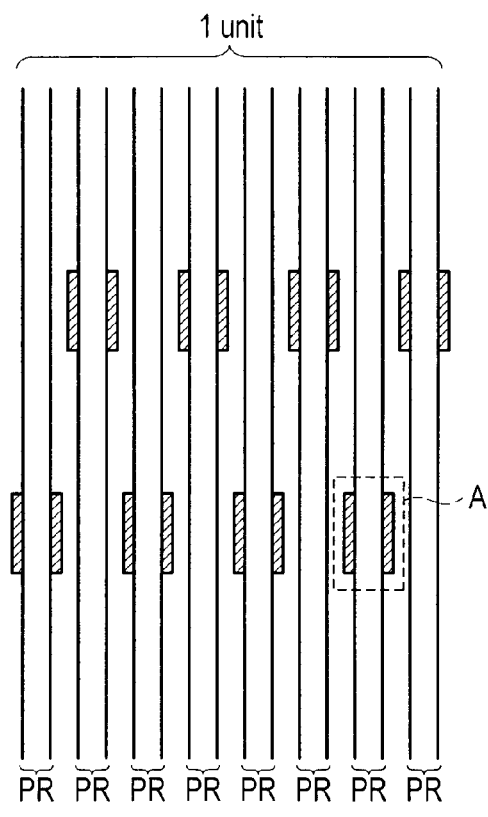
FIG. 12A is a view showing some of power supply lines and contact pads arranged in one unit according to the first embodiment.
Figure 12B:
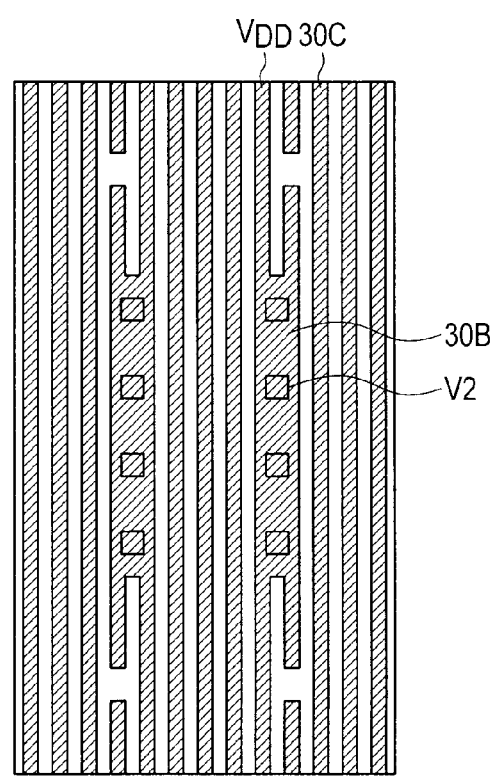
FIG. 12B is an enlarged view of a contact pad portion A depicted in FIG. 12A.
Figure 13A:
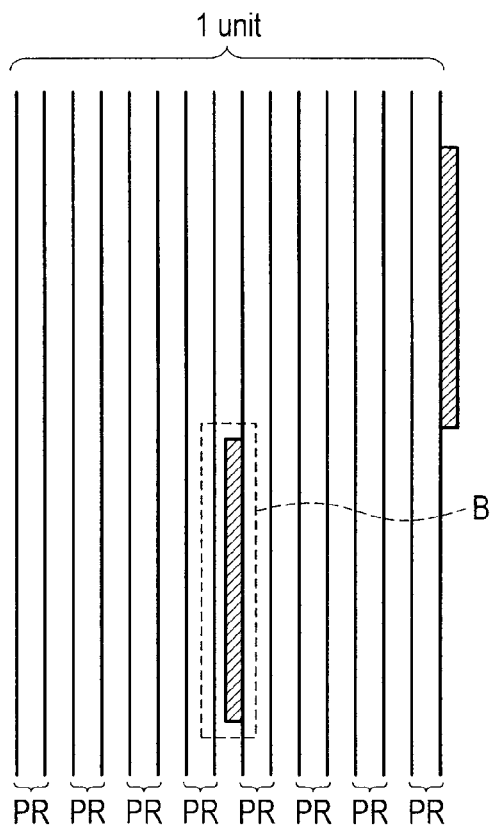
FIG. 13A is a view showing some of power supply lines and contact pads arranged in one unit according to a comparative example.
Figure 13B:
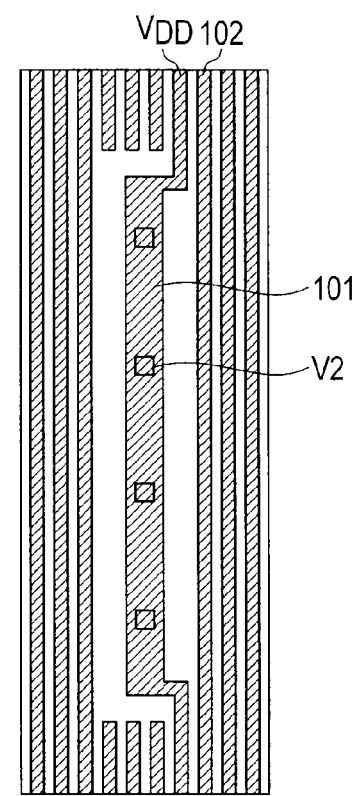
FIG. 13B is an enlarged view of a contact pad portion B depicted in FIG. 13A.
Figure 18:
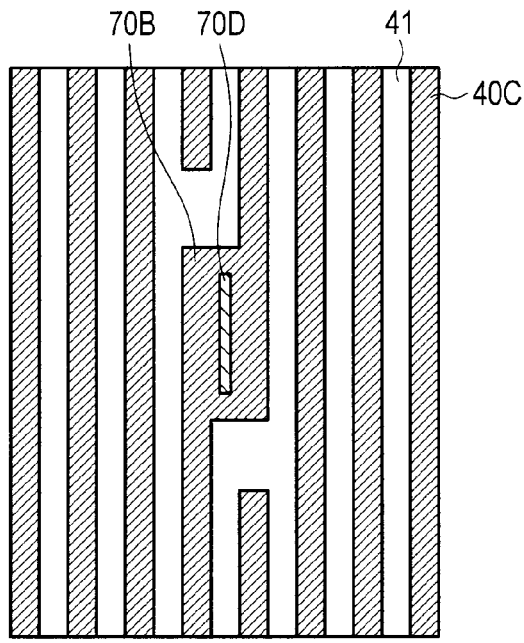
Figure 19:
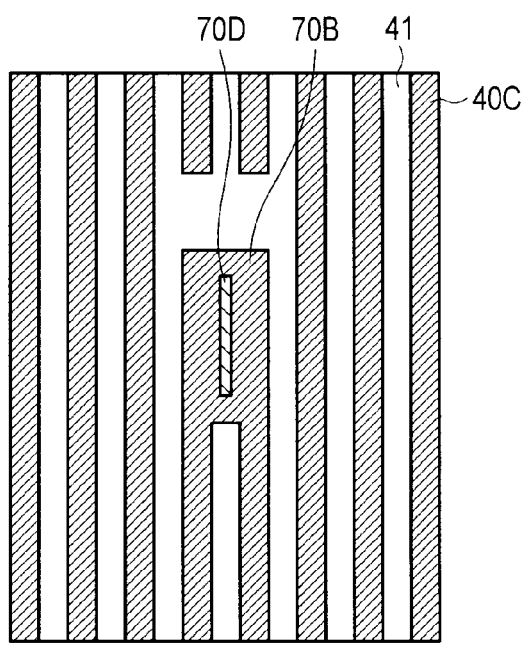
Figure 20:
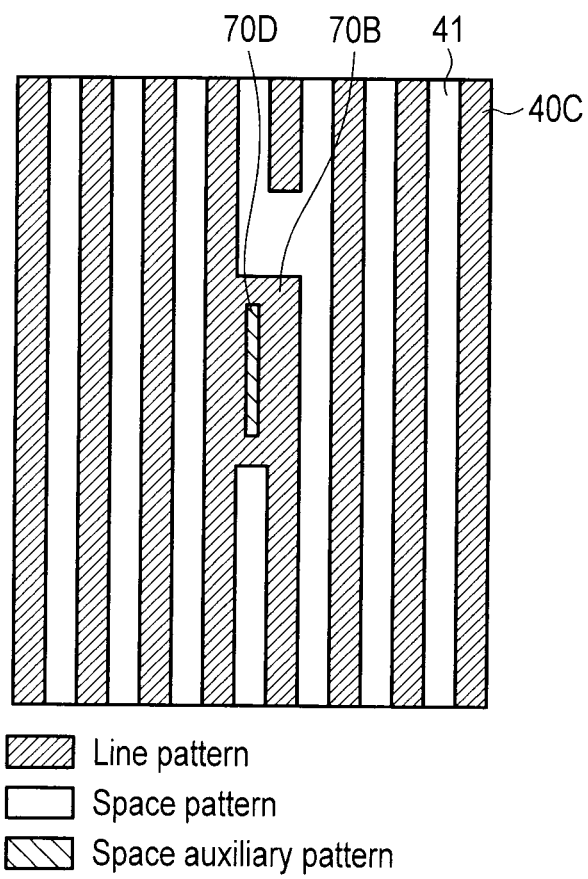

FIG. 12A is a view showing the power supply line pairs and the contact pads arranged in one unit according to this embodiment. FIG. 12B is an enlarged view of a contact pad portion A depicted in FIG. 12A. FIG. 13A is a view showing power supply line pairs and contact pads arranged in one unit according to a comparative example. FIG. 13B is an enlarged view of a contact pad portion B depicted in FIG. 13A. In FIG. 12A and FIG. 13A, the power supply lines at both ends in each power supply line pair PR and the contact pad portion are shown, and any other interconnect lines are omitted. Since the middle power supply line in the power supply line pair PR is omitted since it is sandwiched between the signal lines BUS, the contact pad cannot be formed.

In both this embodiment and the comparative example, eight power supply line pairs PR are aligned. In the comparative example, as shown in FIG. 13A, a contact pad portion B is arranged on a power supply line in the power supply line pair at a lower portion of the center. Contact pads connected to a power supply voltage in one unit are formed in the contact pad portion B. Likewise, a contact pad portion is arranged on a power supply line in the power supply line pair PR at an upper right end portion. Contact pads connected to a reference voltage in one unit are formed in this contact pad portion.

FIG. 13B is an enlarged view of the contact pad portion B. In the contact pad portion according to the comparative example, if a contact pad 101 has a line width that is, e.g., triple a predetermined pitch, an approximately double line width is required for a space between the contact pad 101 and an adjacent interconnect line 102 because of the restriction of the MSR. Therefore, a region corresponding to four interconnect lines is required for the contact pad 101 and the space. Accordingly, the contact pad portions can be formed on the interconnect lines at two positions only in one unit.

On the other hand, in this embodiment, as shown in FIG. 12A, contact pad portions A are dispersed and arranged in one unit.

FIG. 12B is an enlarged view of the contact pad portion A. In the contact pad portion according to this embodiment, if the contact pad 30B has a line width that is, e.g., triple a predetermined pitch, a space between the contact pad 30B and the adjacent interconnect line 30C can be equal to a space between the interconnect lines 30C since there is no restriction of the MSR. Therefore, a region corresponding to two interconnect lines can suffice for the contact pad 30B and the space. Accordingly the contact pad portions A can be dispersed and arranged at eight positions in one unit. It is to be noted that a planar shape of the contact pad 30B is an H-like shape.

That is, in the comparative example, as shown in FIG. 13A, the contact pads are arranged at two positions in the unit in a concentrated manner. Therefore, a current concentrates on one power supply line to cause deterioration or breakage of the power supply line, and reliability may be possibly reduced. On the other hand, in this embodiment, as shown in FIG. 12A, the contact pads are dispersed and arranged in the unit. As a result, the current can uniformly flow through the respective power supply lines, deterioration or breakage of the power supply lines can be reduced, and the reliability can be improved.

Second Embodiment

[1] Configuration of Pattern Layout

Although the planar shape of the contact pad in the first embodiment is the H-like shape, a planar shape of a contact pad is a rectangular shape a second embodiment. Even if the contact pad is formed to have the rectangular planar shape, the same functions and effects as those in the first embodiment can be obtained.

FIG. 14 is a plan view of a pattern layout according to the second embodiment and shows an M1 interconnect layer formed in a sense amplifier 13. Here, an M2 interconnect layer 33 and a contact plug V2 are omitted.

As shown in FIG. 14, a first line pattern 300, a space pattern 31, and a contact pad 60B are arranged on an interlayer insulating film of a semiconductor substrate. The first line pattern 30C is an interconnect line made of, e.g., a metal material. The space pattern 31 is formed of an interlayer insulating film arranged between lines of the first line pattern 30C and between the first line pattern 30C and the contact pad 60B. The contact pad 60B is made of, e.g., a metal material, and a contact plug is formed thereon.

The first line pattern 30C and the space pattern 31 are alternately aligned in a first direction with a predetermined pitch (e.g., 100 nm). The first line pattern 30C and the space pattern 31 extend in a second direction orthogonal to the first direction. The contact pad 60B having a width that is triple the predetermined pitch (e.g., 300 nm) is arranged in the layout of the aligned first line pattern 30C and space pattern 31.

In other words, a pattern array in which the first line pattern 30C and the space pattern 31 are alternately aligned is arranged on the predetermined pitch which is a fixed interval in the first direction. In this pattern array, the contact pad 60B having the width that is triple the predetermined pitch is arranged. A planar shape of the contact pad 60B is a rectangular shape, e.g., an oblong shape.

[2] Pattern Layout of Photomask

A photomask used for manufacturing an M1 interconnect layer including the contact pad 60B and the first line pattern 30C depicted in FIG. 14 will now be described.

FIG. 15 shows a mask pattern of a photomask used for manufacturing a pattern layout of the M1 interconnect layer depicted in FIG. 14. The mask pattern shown in FIG. 15 is a mask pattern when forming a film, which is to function as the pattern, and then etching the film to form the pattern.

On a substrate of the photomask are formed a line pattern 70B associated with the contact pad 60B depicted in FIG. 14, a line pattern 40C associated with the first line pattern 30C, and a space pattern 41 associated with the space pattern 31.

The line pattern 40C and the space pattern 41 are alternately aligned in the first direction with a predetermined pitch (e.g., 100 nm). The line pattern 40C and the space pattern 41 extend in the second direction orthogonal to the first direction. The line pattern 70B having a width that is triple the predetermined pitch (e.g., 300 nm) is arranged in the layout of the aligned line pattern 40C and the space pattern 41. A space auxiliary pattern 70D is arranged on a predetermined pitch of a space pattern in the line pattern 70B. A space width of the space auxiliary pattern 70D is, e.g., 30 nm or below. For example, a standardized dimension (=a k1 factor) is set to 0.23 or below.

In other words, a pattern array in which the line pattern 40C and the space pattern 41 are alternately aligned is arranged on the predetermined pitch which is a fixed interval in the first direction. The line pattern 70B having the width that is triple the predetermined pitch is arranged in this pattern array. The space auxiliary pattern 70D is arranged on a predetermined pitch of the space pattern in the line pattern 70B. A planar shape of the line pattern 70B associated with the contact pad 60B is a rectangular shape, e.g., an oblong shape.

In the case of a halftone mask, each of the line pattern 70B and 40C is a region having a transmission factor of 6% and a phase of 180 degrees, and each of the space patterns 41 and the line auxiliary pattern 70D is a region having a transmission factor of 100% and a phase of 0 degrees. In the case of a binary mask, each of the line pattern 70B and 40C is a region having a transmission factor of 0%, and each of the space patterns 41 and the line auxiliary pattern 70D is a region having a transmission factor of 100% and a phase of 0 degrees.

It is to be noted that the description has been given as to the mask pattern when forming the film, which is to function as the pattern, and then etching the film to form the pattern with reference to FIG. 15, but the embodiment is not restricted thereto, and a mask pattern configured to form a pattern based on the burying method may be adopted. That is, it is possible to use a mask pattern in which the line patterns 70B and 40C are substituted by space patterns, the space pattern 41 is substituted by a line pattern, and the space auxiliary pattern 70D is substituted by a line auxiliary pattern, respectively in FIG. 15.

Any other structures and effects are equal to those in the first embodiment, thereby omitting description thereof.

As explained above, according to the first and second embodiment, in forming the interconnect lines of the core circuit portion in the sense amplifier and the like, periodicity of L&S can be maintained by using the auxiliary pattern (sraf: sub resolution assist feature) to form the pattern of the contact pads. As a result, the lithography margin can be improved. Furthermore, since the restriction of the MSR on the circumference of each contact pad is eliminated by maintaining the periodicity of L&S, the number of interconnect lines to be installed around each contact pad can be increased, and the freedom degree of layout design can be improved.

As explained above, according to the first and second embodiment, it is possible to provide the semiconductor device having the pattern layout which can increase the number of interconnect lines that can be formed in a predetermined region including the contact pad and also improve the freedom degree of design layout.

Additionally, in a situation where the first or second embodiment is applied, a considerable effect can be obtained when the contact pad having a width that is several-fold the pattern pitch is also present in the periodic pattern of L&S and a large space must be assured between the interconnect line and the contact pad because of restrictions of the MSR (Multi Space Rule) and the like. An alignment pitch of L&S in this case is, e.g., 100 nm or below. It is to be noted that the effect can be obtained as a matter of course even if the alignment pitch is greater than 100 nm.

Further, in a situation where an index k1 factor indicative of a difficulty level of resolution in an exposure process is not greater than 0.4, a remarkable effect can be expected when the first or second embodiment is applied. The k1 factor is a value that corresponds to a normalized line width and indicates a difficulty level of resolution, and a smaller value means harder resolution. Assuming that RP is a resolution line width, NA is a numerical aperture of an exposure system, and λ is an exposure wavelength, an expression $$k1 = RP(NA/\lambda) \quad \text{(Expression 1)}$$

can be achieved. It is to be noted that, even if the k1 factor is greater than 0.4, the effect of improving an exposure margin can be obtained by applying this embodiment.

Other Embodiments

As other embodiments, a pattern array may De formed by use of the photomasks shown in FIGS. 16-20.

FIGS. 16-20 are plan views of mask patterns of photomasks according to other embodiments. In the photomask shown in FIG. 16, a rectangular line pattern 70B is formed, and in addition a line pattern 40C, a space pattern 41 and a space auxiliary pattern 70D are formed. A pattern array formed by use of these photomasks has advantages similar to those of the first and second embodiments described above.

In the photomasks shown in FIGS. 17-20, one or a number of line patterns extend from the rectangular line pattern 70B of the mask patterns. A pattern array formed by use of such photomasks has advantages similar to those of the first and second embodiments.

As described above, according to the embodiments, it is possible to provide the semiconductor device having the pattern layout which can increase the number of interconnect lines that can be formed in a predetermined region including the contact pad and also improve the freedom degree of design layout.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device having a pattern layout comprising:
   a first power supply line which extends in one direction and to which a first voltage is supplied;
   second and third power supply lines which extend in the one direction and are arranged to sandwich the first power supply line therebetween and to which a second voltage is supplied;
   a first signal line which is arranged between the first power supply line and the second power supply line and to which data read from memory cells is transmitted;
   a second signal line which is arranged between the first power supply line and the third power supply line and to which data read from the memory cells is transmitted;
   a first contact pad which is connected to the second power supply line and electrically connected to an upper interconnect line arranged on the second power supply line; and
   a second contact pad which is connected to the third power supply line and electrically connected to an upper interconnect line arranged on the third power supply line.

2. The device according to claim 1,
   wherein the first, second, and third power supply lines and the first and second signal lines are aligned with a predetermined pitch, and
   each of the first and second contact pads has a width that is triple the predetermined pitch.

3. The device according to claim 1,
   wherein a planar shape of each of the first and second contact pads is an H-like shape.

4. A semiconductor device having a pattern layout comprising:
   a memory cell array having memory cells;
   a sense amplifier which is arranged at one end of the memory cell array and reads data stored in the memory cells,
   a first interconnect pattern in which lines and spaces are alternately aligned in a first direction with a predetermined pitch; and
   a contact pad which is arranged between the lines in the first interconnect pattern and has a width that is triple the predetermined pitch,
   wherein the first interconnect pattern and the contact pad are arranged in a region where the sense amplifier is formed,
   an interval between the lines in the first interconnect pattern and the contact pad is the predetermined pitch, and
   the predetermined pitch is 100 nm or below,
   a planar shape of the contact pad is an H-like shape,
   the first interconnect pattern comprises:
      a first power supply line which extends in a second direction and to which a first voltage is supplied;
      second and third power supply lines which extend in the second direction and are arranged to sandwich the first power supply line therebetween and to which a second voltage is supplied;
      a first signal line which is arranged between the first power supply line and the second power supply line and to which data read from the memory cells is transmitted; and
      a second signal line which is arranged between the first power supply line and the third power supply line and to which data read from the memory cells is transmitted; and
   the contact pad comprises:

a first contact pad which is connected to the second power supply line and electrically connected to an upper interconnect line arranged on the second power supply line; and a second contact pad which is connected to the third power supply line and electrically connected to an upper interconnect line arranged on the third power supply line.

5. The device according to claim 4,
wherein the second direction is orthogonal to the first direction.

6. The device according to claim 4,
wherein the first interconnect pattern and the contact pad are manufactured by using a photomask, and
the photomask comprises:
a line pattern in which lines and spaces are alternately aligned in the first direction with the predetermined pitch;
a contact pad pattern which is arranged between the lines in the line pattern and has a width that is triple the predetermined pitch; and
a space auxiliary pattern which is arranged on the predetermined pitch in the contact pad pattern and not resolved by exposure.

7. The device according to claim 6,
wherein a planar shape of the contact pad pattern is an H-like shape.

8. The device according to claim 6,
wherein each of the line pattern and the contact pad pattern is a region having a transmission factor of 6% and a phase of 180 degrees, and the space auxiliary pattern is a region having a transmission factor of 100% and a phase of 0 degrees.

9. A semiconductor device having a pattern layout comprising:
a memory cell array having memory cells;
a sense amplifier which is arranged at one end of the memory cell array and reads data stored in the memory cells,
a first interconnect pattern in which lines and spaces are alternately aligned in a first direction with a predetermined pitch; and
a contact pad which is arranged between the lines in the first interconnect pattern and has a width that is triple the predetermined pitch,
wherein the first interconnect pattern and the contact pad are arranged in a region where the sense amplifier is formed,
an interval between the lines in the first interconnect pattern and the contact pad is the predetermined pitch, and
the predetermined pitch is 100 nm or below, a planar shape of the contact pad is a rectangular shape,
the first interconnect pattern comprises:
a first power supply line which extends in a second direction and to which a first voltage is supplied;
second and third power supply lines which extend in the second direction and are arranged to sandwich the first power supply line therebetween and to which a second voltage is supplied;
a first signal line which is arranged between the first power supply line and the second power supply line and to which data read from the memory cells is transmitted; and
a second signal line which is arranged between the first power supply line and the third power supply line and to which data read from the memory cells is transmitted; and
the contact pad comprises:
a first contact pad which is connected to the second power supply line and electrically connected to an upper interconnect line arranged on the second power supply line; and
a second contact pad which is connected to the third power supply line and electrically connected to an upper interconnect line arranged on the third power supply line.

10. The device according to claim 9,
wherein the second direction is orthogonal to the first direction.

11. The device according to claim 9,
wherein the first interconnect pattern and the contact pad are manufactured by using a photomask, and
the photomask comprises:
a line pattern in which lines and spaces are alternately aligned in the first direction with the predetermined pitch;
a contact pad pattern which is arranged between the lines in the line pattern and has a width that is triple the predetermined pitch; and
a space auxiliary pattern which is arranged on the predetermined pitch in the contact pad pattern and not resolved by exposure.

12. The device according to claim 11,
wherein a planar shape of the contact pad pattern is a rectangular shape.

13. The device according to claim 11,
wherein each of the line pattern and the contact pad pattern is a region having a transmission factor of 6% and a phase of 180 degrees, and the space auxiliary pattern is a region having a transmission factor of 100% and a phase of 0 degrees.

* * * * *